(12) United States Patent
Hsu et al.

(10) Patent No.: US 12,094,741 B2
(45) Date of Patent: Sep. 17, 2024

(54) SYSTEM AND METHOD FOR AUTOMATED MATERIAL HANDLING MANAGEMENT

(71) Applicant: Taiwan Semiconductor Manufacturing Company, Ltd., Hsinchu (TW)

(72) Inventors: Chieh Hsu, Hsinchu (TW); Guancyun Li, Toufen Town (TW); Ching-Jung Chang, Taichung (TW); Chi-Feng Tung, Jhunan Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 707 days.

(21) Appl. No.: 17/379,734

(22) Filed: Jul. 19, 2021

(65) Prior Publication Data

US 2022/0336242 A1 Oct. 20, 2022

Related U.S. Application Data

(60) Provisional application No. 63/175,832, filed on Apr. 16, 2021.

(51) Int. Cl.
*H01L 21/67* (2006.01)
*G05B 19/418* (2006.01)
*H01L 21/677* (2006.01)

(52) U.S. Cl.
CPC .... *H01L 21/67276* (2013.01); *G05B 19/4189* (2013.01); *H01L 21/67724* (2013.01); *H01L 21/67733* (2013.01)

(58) Field of Classification Search
CPC ......... H01L 21/67276; H01L 21/67724; H01L 27/6733; G05B 19/4189
See application file for complete search history.

(56) References Cited

U.S. PATENT DOCUMENTS

| | | | | |
|---|---|---|---|---|
| 2008/0281456 A1* | 11/2008 | Chen | .................. | G05B 19/4189 700/112 |
| 2009/0202336 A1* | 8/2009 | Shah | ................ | G05B 19/41815 901/50 |
| 2010/0023160 A1* | 1/2010 | Chen | ................ | G05B 19/41895 198/804 |
| 2014/0068753 A1* | 3/2014 | Gonzalez | ........... | G05B 19/4189 726/17 |

FOREIGN PATENT DOCUMENTS

| | | |
|---|---|---|
| TW | 200615811 A | 5/2006 |
| TW | 200807603 A | 2/2008 |
| TW | 201931228 A | 8/2019 |

* cited by examiner

*Primary Examiner* — Kyle O Logan
(74) *Attorney, Agent, or Firm* — Lippes Mathias LLP (57) ABSTRACT

An AMHS interface management system configured to facilitate the exchange of lot information between distinct AMHS systems. The AMHS interface management system receives lot information from a first AMHS system in a first format and translates the lot information into a format associated with a second AMHS system. The AMHS interface management system utilizes a handshake area located between the first and second AMHS systems. The handshake area includes one or more vehicles that facilitate the movement of a lot between the first AMHS system and the second AMHS system.

20 Claims, 5 Drawing Sheets

SYSTEM AND METHOD FOR AUTOMATED MATERIAL HANDLING MANAGEMENT

PRIORITY CLAIM AND CROSS-REFERENCE

This application claims the benefit of U.S. Provisional Application Ser. No. 63/175,832 filed Apr. 16, 2021 and titled NEW DESIGN FOR AN AUTOMATED MATERIAL HANDLING SYSTEM (AMHS) INTERFACE MANAGEMENT SYSTEM. U.S. Provisional U.S. Provisional Application Ser. No. 63/175,832 filed Apr. 16, 2021 and titled NEW DESIGN FOR AN AUTOMATED MATERIAL HANDLING SYSTEM (AMHS) INTERFACE MANAGEMENT SYSTEM is incorporated herein by reference in its entirety.

BACKGROUND

The following relates to automated material handling systems, manufacturing execution systems, and cross-system fabrication. The manufacture of semiconductor devices involves the performance of a series of process steps using a variety of high tech production and metrology tools in a certain order and often within a certain period of time. The primary function of a wafer logistics system in a wafer fabrication facility, or "fab," is to deliver the wafers to each of the tools at the right time, as well as to track the location and status of the wafers throughout the process. Automated material handling systems ("AMHS") and/or manufacturing execution systems ("MES") are applied to wafer fabs to carry out the automated functions more efficiently, consistently, and safely than can be done via manual means. The fabrication process often results in the need for cross-floor and cross-phase transportation within a single fab and/or cross-fab transportation between fabs. This includes utilizing different AMHS's within the same fab or varying across different fabs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor foundry may include a plurality of fabs. During processing, a lot may be transferred between the plurality of fabs for different steps of the manufacturing process. A "cross-fab transfer" involves the transfer of a lot, e.g., a wafer carrier, a group of wafer carriers, etc., from one fab to another. It should be noted that the different fabs are different insofar as they may occupy different physical spaces (e.g., different buildings or different floors or suites within a same building), and/or may constitute self-contained sub-processing lines. In general, the different fabs may reside in the same building, or in different buildings. A "cross-AMHS transfer" involves the transfer of a lot from one AMHS to another AMHS, regardless of whether the AMHSs are separate systems within a single fab or systems in separate fabs. Each fab may include multiple phases and/or multiple floors. In that regard, in some embodiments the fab may be what is referred to as a "Gigafab." A "cross-phase transfer job" involves the transfer of a lot from one phase to another.

Each phase of a fab includes a plurality of bays that may include processing tools or equipment. The equipment within each bay may be interconnected by an intrabay overhead transport ("OHT") system. The bays may be interconnected with the other bays via an interbay OHT system. As will be familiar to those of ordinary skill in the relevant art, the intrabay OHT systems and the interbay OHT system comprise overhead tracks on which OHT vehicles transport wafer carriers containing lots of wafers to be processed to and from the equipment of the bays, often via stockers. In addition to or in lieu of the OHT systems, each fab may include an intrabay and/or interbay overhead shuttle ("OHS") system. Each fab may also include a cross-floor transportation system. The cross-floor transportation system may include lifters and/or other mechanisms for implementing cross-floor transfers of wafer carriers.

When a wafer carrier containing wafers is to be transferred, a manufacturing execution system ("MES") determines to what destination in the fab the wafer carrier should be transferred. However, typical MES systems are limited to a single fab and cannot process cross-fab and/or cross-AMHS transportation requests. The MES system of one fab is often unable to communicate with the MES system of the AMHS of a separate fab. In that regard, different fabs may have different AMHS vendors and communication protocols, e.g. different MES systems with different data formats/structures, etc. In other instances, different AMHS vendors may utilize the same MES system, but different versions of that MES system, such that different data formats/structures between the same type of MES system may occur. When a lot requires process support at a different fab (i.e. under control of a different AMHS and/or MES), the lot information hand-shake may be problematic as exchanging lot information between different vendor based systems is not supported.

Figure 1:
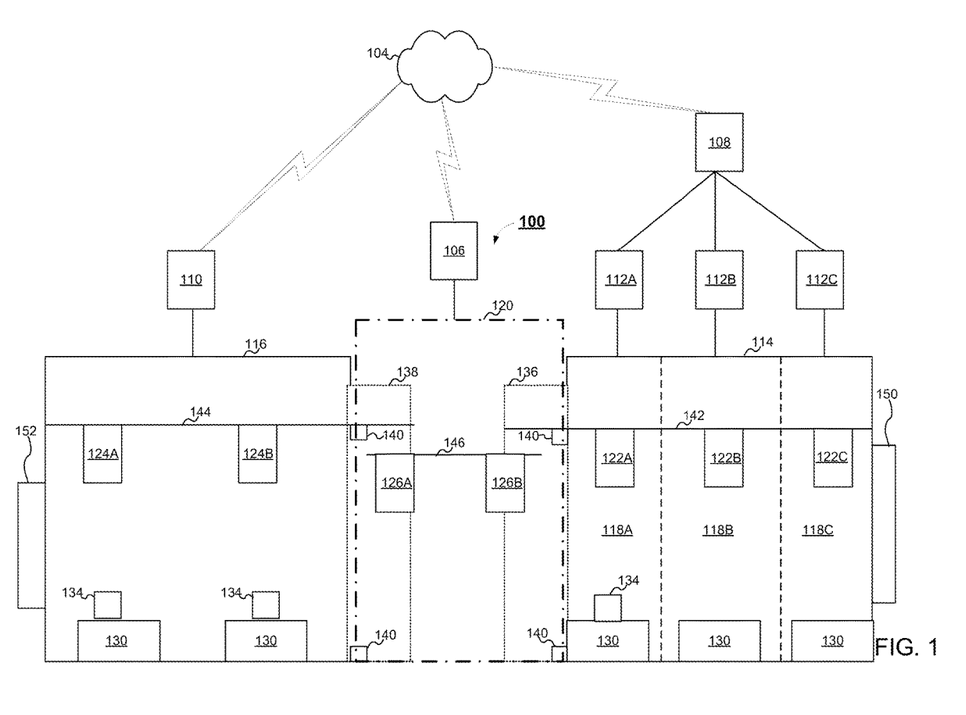
FIG. 1 is a schematic diagram illustrating at least a portion of a manufacturing facility including a plurality of disparate AMHS systems and the AMHS interface management system in accordance with one embodiment of the subject application.

Referring now to FIG. 1, there is shown a schematic diagram illustrating at least a portion of a manufacturing facility including a plurality of disparate AMHS systems and the AMHS interface management system 100 in accordance with one embodiment of the subject application. As depicted in FIG. 1, the AMHS management system 100 includes a handshake control system 106 configured to control operations within a handshake area 120 in accordance with varying embodiments disclosed herein. The manufacturing facility further illustrates a first fab/area 114 operated in accordance with an AMHS A control system 108 and a second fab/area 116 operated in accordance with an AMHS B control system 110. It will be appreciated that the fabs/areas 114-116 are shown for illustrative purposes, and may correspond to individual fabs, multiple fabs, multiple floors of a fab, or any of the like operated utilizing either of the AMHS A control system 108 or AMHS B control system 110. Further, the skilled artisan will appreciate that the illustrated "fabs/areas" 114-116 may correspond to separate buildings or constructs, with the handshake area 120 located between such buildings or constructs. The AMHS interface management system 100 is in data communication with AMHS A control system 108 and AMHS B control system 110 via a communications network 104.

It will be appreciated that the communications network 104 may be a distributed computing environment, such as a computer network, which is representative of any distributed communications system capable of enabling the exchange of data between two or more electronic devices. It will be further appreciated that such a computer network includes, for example and without limitation, a virtual local area network, a wide area network, a personal area network, a local area network, the Internet, an intranet, or the any suitable combination thereof. Accordingly, such a computer network comprises physical layers and transport layers, as illustrated by various conventional data transport mechanisms, such as, for example and without limitation, Token-Ring, Ethernet, or other wireless or wire-based data communication mechanisms. Further, the AMHS management system 100 may be in data communication with the handshake area 120 and the network via a suitable communications link, which may include, for example, any suitable channel of data communications such as wireless communications, for example Bluetooth, WiMax, 802.11a, 802.11b, 802.11g, 802.11(x), a proprietary communications network, infrared, optical, the public switched telephone network, or any suitable wireless data transmission system, or wired communications.

FIG. 1 depicts a first fab/area A 114 under operations of AMHS A control system 108. In accordance with varying embodiments of the subject application. The first fab/area A 114 utilizes a first AMHS system, denoted as AMHS A, in conjunction with a first MES system 150, as will be understood in the art. That is, AMHS A fab/area 114, and the devices and components described hereinafter, are controlled by the AMHS A control system 108 that implements the aforementioned AMHS system and MES system 150.

As shown in FIG. 1, fab/area A is divided into three distinct components or sections, designated A1 118A, A2 118B, and A3 118C. Each of these sections A1-A3 118A-118C may represent distinct fabs, lines, phases, stations, processes, etc., of the manufacturing facility, operating under the overarching control of AMHS A control system 108 and associated MES system 150. Each section A1-A3 118A-118C may include one or more processing tools 130, such as process chambers, stockers, and other equipment operable in accordance with the AMHS A control system 108. The skilled artisan will appreciate that a single tool 130 is depicted in each area A1-A3 118A-118C in FIG. 1 for exemplary purposes only, and each area A1-A3 may employ multiple processing tools 130. For illustrative purposes, a controller is depicted for each area A1-A3, designated in FIG. 1 as controller A1 112A, controller A2 112B, and controller A3 112C. It will be appreciated that the controllers 112A-112C may be distinct devices in communication with the various devices in each respective area A1-A3 118A-C, may be components of the AMHS A control system 108, or any suitable combination thereof. In some embodiments, each controller 112A-112C includes a processor in communication with memory and various interfacing components configured for command, control, and/or communication with the processing tools 130 located within each respective area A1-A3 (118A-C).

Further illustrated in each area A1-A3 (118A-C) are vehicles (VHL) designated as VHL A1 122A in area A1 118A, VHL A2 122B in area A2 118B, and VHL A3 122C in area A3 118C. It will be understood that these vehicles A1-A3 122A-C may be representative of single vehicles or multiple vehicles in each area A1-A3 118A-C, depending upon their respective sizes and configurations. Further, the skilled artisan will appreciate that the vehicles A1-A3 122A-C may correspond to OHT vehicles configured to transport wafer carriers or lots 134 between areas A1-A3 118A-C and/or between processing tools 130 located within each area A1-A3 118A-C.

For illustrative purposes, FIG. 1 depicts a single rail 142 extending through the fab/area 114, rather than depicting multiple rails as will be understood to be present within a manufacturing facility. The rail 142 is depicted as extending across fabs/areas 118A-C, enabling vehicles 122A-C to transfer lots 134 between processing tools 130 and areas/fabs 118A-C. In alternative embodiments, multiple rails may be utilized within the fab/area 114, or within each individual area 118A-C in accordance with the varying needs of fabrication. As shown in FIG. 1, the rail 142 extends out of the area/fab 114 under control of the AMHS A control system 108 and at least a portion into the handshake area 120. In some embodiments, the rail 142 extends into a transfer area 136 of the handshake area 120, as illustrated in FIG. 1. According to such an embodiment a VHL 122A-C may transit along the rail 142 carrying (or to pick up) a wafer carrier (lot 134) into or out of the transfer area 136, as discussed in greater detail below.

The facility depicted in FIG. 1 further includes a second fab/area operating in accordance with a second AMHS system. For explanatory purposes, the second fab/area is denoted as AMHS B fab/area 116 in the attached figures. The second fab/area B 116 utilizes a second AMHS system, denoted as AMHS B, in conjunction with a second MES system 152, as will be understood in the art. That is, AMHS B fab/area 116, and the devices and components described hereinafter, are controlled by the AMHS B control system 110 that implements the aforementioned AMHS B system and MES system 152. The skilled artisan will appreciate that AMHS A 114 and AMHS B 116 may correspond to fabs/areas provided by or produced by different vendors (i.e. equipment manufacturers, control system manufacturers, etc.). Further, the MES system 150 and the MES system 152 may be different versions of the same MES system (e.g. version 1.0 for MES system 150 and version 1.2 for MES system 152), or different MES systems entirely (e.g. MES system 150 produced by vendor A and MES system produced by vendor B).

As shown in FIG. 1, fab/area B 116 is presented as a single section of the manufacturing facility, operating in accordance with the AMHS B control system 110. Accordingly, fab/area B 116 may include one or more processing tools 130, such as process chambers, stockers, and other equipment operable in accordance with the AMHS B control system 110 and associated MES system 152. Although illustrated in FIG. 1 as contained two process tools 130, it will be appreciated that any number of tools 130 may be present in fab/area B 116, and the representation depicted in FIG. 1 is intended for example purposes only. In contrast to the multi-section fab/area A 114, fab/area B 116 utilizes the AMHS B control system 110, rather than separate controllers 112A-C.

Fab/area B 116 further illustrates vehicles (VHL) designated as VHL B1 124A and VHL B2 124B. It will be understood that these vehicles B1-B2 124A-B may be representative of single vehicles or multiple vehicles within fab/area B 116, depending upon its respective size and configuration. Further, the skilled artisan will appreciate that the vehicles B1-B2 124A-B may correspond to OHT vehicles configured to transport wafer carriers or lots 134 between processing tools 130 located within the fab/area B 116. As will be understood by those skilled in the art, an OHT system may employ a plurality of rails and vehicles in accordance with the size, shape and location of a fab/area. Accordingly, while illustrated in FIG. 1 as a single rail 144 within fab/area B 116, the skilled artisan will appreciate that multiple overhead rails may be present along which VHL B1 124A and VHL B2 124B traverse. The rail 142 is depicted as extending across the entirety of fab/area B 116, enabling VHL B1 124A and VHL B2 124B to transfer lots 134 between processing tools 130.

In accordance with one embodiment, the rail 144 illustrated in FIG. 1 extends out of the fab/area B 116 under control of the AMHS B control system 110 and at least a portion into the handshake area 120. In some embodiments, the rail 144 extends into a transfer area 138 of the handshake area 120, as illustrated in FIG. 1. According to such an embodiment a VHL 124A-B may transit along the rail 144 carrying (or to pick up) a wafer carrier (lot 134) into or out of the transfer area 138, as discussed in greater detail below.

Positioned between fab/area A 114 and fab/area B 116 is the AMHS interface management system 100 in accordance with one embodiment of the subject application. As indicated above, the AMHS interface management system 100 includes a portion of the fabrication facility designated as the handshake area 120. The handshake area 120 may correspond to an open location between fabs/areas A 114 and B 116, an enclosed structure similar to a fab, a separate building, or the like. The handshake area 120 includes the transfer area 136 proximate to the fab/area A 114 and the transfer area 138 proximate to the fab/area B 116.

The AMHS interface management system 100 may further include one or more vehicles VHL C1 126A and VHL C2 126B operable within the handshake area 120 and in accordance with the handshake control system 106. As illustrated in FIG. 1, the handshake area 120 includes at least one rail 146 that extends into the transfer areas 136 and 138, enabling VHL C1 126A and/or VHL C2 126B to move into and out of such transfer area 136, 138. According to one embodiment, the transfer areas 136 and 138 may be implemented as part of the structure of the fabs/areas A-B 114-116, wherein control of devices within the transfer area 136 or 138 may be retained by the AMHS A control system 108, the AMHS B control system 110. According to another embodiment, when a vehicle (122A-C or 124A-B) transits into the respective transfer area 136, 138, control of such vehicle 122A-C or 124A-B may be transferred to the handshake control system 106.

The transfer areas 136 and 138 may include one or more sensors 140 positioned to track movement of vehicles 122A-C or 124A-B into and out of the transfer areas 136 and 138. In such an implementation, the handshake control system 106 may receive data from the sensors 140 and utilize the data for various tracking, monitoring, and control functions, as discussed in greater detail below.

Figure 2:
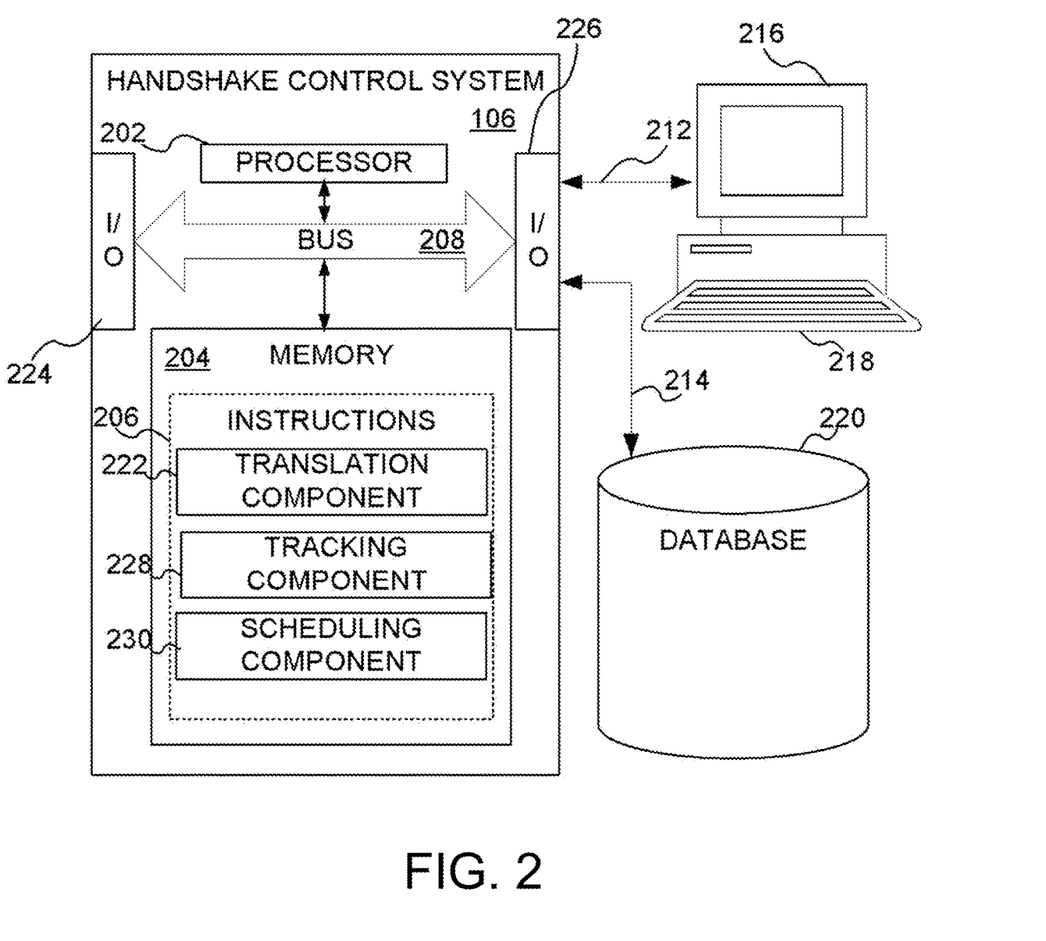
FIG. 2 is a block diagram of a handshake control system of the AMHS interface management system in accordance with one embodiment of the subject application.

Turning now to FIG. 2, there is shown an illustrative block diagram of a suitable handshake control system 106 in accordance with one embodiment of the subject application.

The various components of the handshake control system 106 may be connected by a data/control bus 208. The processor 202 of the handshake control system 106 is in communication with an associated database 220 via a link 214. A suitable communications link 214 may include, for example, the public switched telephone network, a proprietary communications network, infrared, optical, or other suitable wired or wireless data communications. The database 220 is capable of implementation on components of the handshake control system 106, e.g., stored in local memory 204, i.e., on hard drives, virtual drives, or the like, or on remote memory accessible to the handshake control system 106.

The associated database 220 is representative of any organized collections of data (e.g., lot information, traffic flow information, process tool information, vehicle status information, fabrication information, material information, one or more lookup tables, translation information, etc.) used for one or more purposes. In accordance with one exemplary embodiment, the database 220 stores translation algorithms to translate between different AMHS formats used by different vendors/manufacturers, as well as multiple algorithms for translation between different MES systems, different versions of the same original MES system, and the like. In other embodiments, the database 220 stores a commercial/proprietary format database or lookup table of commands, terms, and instructions that is searchable by the system 106 to translate lot information from one AMHS/MES to another AMHS/MES. The skilled artisan will appreciate that such information may be updated via machine learning during operations of the subject system 100. Implementation of the associated database 220 is capable of occurring on any mass storage device(s), for example, magnetic storage drives, a hard disk drive, optical storage devices, flash memory devices, or a suitable combination thereof. The associated database 220 may be implemented as a component of the handshake control system 106, e.g., resident in memory 204, or the like. In one embodiment, the associated database 220 may include data corresponding to production scheduling, OHT information, vehicle information (e.g. speed, position, status, etc.), lot information, priority information, AMHS/MES format conversion information, and the like.

The handshake control system 106 may include one or more input/output (I/O) interface devices 224 and 226 for communicating with external devices. The I/O interface 226 may communicate, via communications link 212, with one or more of a display device 216, for displaying information, such estimated destinations, and a user input device 218, such as a keyboard or touch or writable screen, for inputting text, and/or a cursor control device, such as mouse, trackball, or the like, for communicating user input information and command selections to the processor 202. The I/O interface 224 may communicate with external devices such as the AMHS A controller 108, the AMHS B controller 110, the vehicles (122A-C, 124A-B, 126A-B), the sensors 140, via the computer network 104, or directly via any suitable wired or wireless communications channels.

It will be appreciated that the handshake control system 106 illustrated in FIG. 2 is capable of implementation using a distributed computing environment, such as a computer network, which is representative of any distributed communications system capable of enabling the exchange of data between two or more electronic devices. It will be further appreciated that such a computer network includes, for example and without limitation, a virtual local area network, a wide area network, a personal area network, a local area network, the Internet, an intranet, or any suitable combination thereof. Accordingly, such a computer network comprises physical layers and transport layers, as illustrated by various conventional data transport mechanisms, such as, for example and without limitation, Token-Ring, Ethernet, or other wireless or wire-based data communication mechanisms. Furthermore, while depicted in FIG. 2 as a networked set of components, the handshake control system 106 is capable of implementation on a stand-alone device adapted to interact with the AMHS interface management system 100 described herein.

The handshake control system 106 may include one or more of a computer server, workstation, personal computer, cellular telephone, tablet computer, pager, combination thereof, or other computing device capable of executing instructions for performing the exemplary method.

According to one example embodiment, the handshake control system 106 includes hardware, software, and/or any suitable combination thereof, configured to interact with an associated user, a networked device, networked storage, remote devices, or the like.

The memory 204 may represent any type of non-transitory computer readable medium such as random access memory (RAM), read only memory (ROM), magnetic disk or tape, optical disk, flash memory, or holographic memory. In one embodiment, the memory 204 comprises a combination of random access memory and read only memory. In some embodiments, the processor 202 and memory 204 may be combined in a single chip. The network interface(s) 224, 226 allow the computer to communicate with other devices via a computer network, and may comprise a modulator/demodulator (MODEM). Memory 204 may store data processed in the method as well as the instructions for performing the exemplary method.

The digital processor 202 can be variously embodied, such as by a single core processor, a dual core processor (or more generally by a multiple core processor), a digital processor and cooperating math coprocessor, a digital controller, or the like. The digital processor 202, in addition to controlling the operation of the handshake control system 106, executes instructions 206 stored in memory 204 for performing the method set forth hereinafter. It will be appreciated that the components of the handshake control system 106 may be representative of similar components present in the AMHS A control system 108, the controllers 112A-C, and the AMHS B control system 110. Further, the skilled artisan will appreciate that while illustrated as separate, networked components, each of the aforementioned devices may be present on single device, in network communication with the various devices in each of the AMHS A fab/area 114, the AMHS B fab/area 116, and the handshake area 120.

Figure 3:
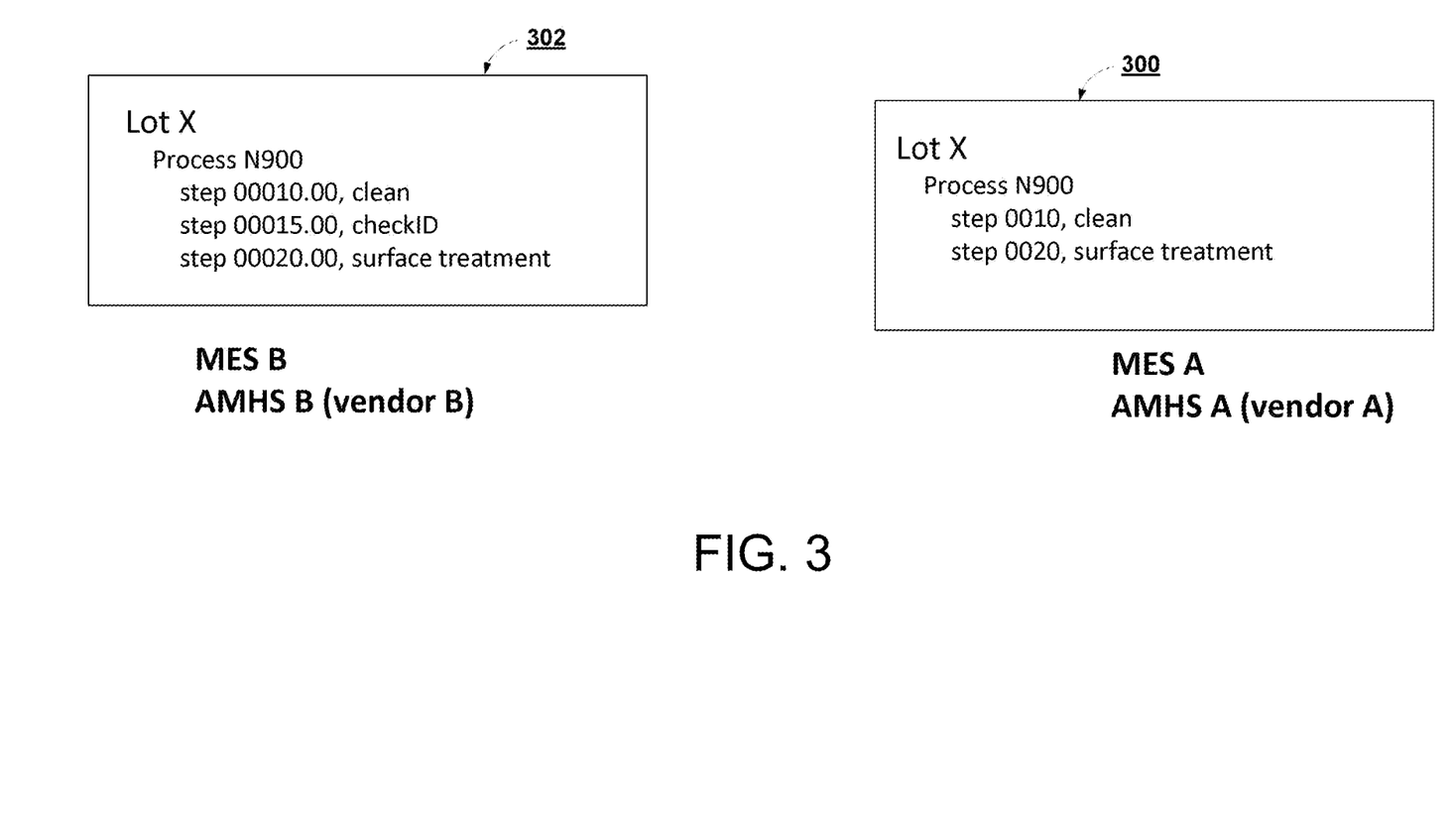
FIG. 3 is a representative image of lot information of disparate AMHS/MES systems in accordance with one embodiment of the subject application.

Returning to FIG. 2, the instructions 206 stored in memory 204 may include a translation component 222 configured to translate lot information associated with a lot 134 from one AMHS/MES combination to another AMHS/MES combination, e.g., from AMHS A/MES 150 to AMHS B/MES 152. FIG. 3 provides an illustrative example of lot information 300 as utilized by AMHS A/MES 150 and lot information 302 as utilized by AMHS B/MES 152, where MES 150 and MES 152 are distinct manufacturing execution systems. The translation component 222 of the handshake control system 106 is configured to translate the data structure, format, and instruction set from that of MES 150 in AMHS A into that which is utilized by MES 152 in AMHS B. In some embodiments, the translation component 222 may utilize the database 220 to retrieve correlating commands to assist in translating lot information 300 into lot information 302.

As illustrated in FIG. 2, the instructions 206 also include a tracking component 228 configured to track the position of vehicles 122A-C, 124A-B, and 126A-B as they transit into and out of the handshake area 120, i.e. vehicles 122A-C into and out of the transfer area 136, vehicles 124A-B into and out of the transfer area 138, and vehicles 126A-B as they move throughout the handshake area 120. In accordance with one embodiment, the tracking component 228 receives sensor data from the sensors 140 positioned at the entrance to the transfer areas 136, 138, enabling a determination as to which vehicle 122A-C or 124A-B has entered/exited, the speed with which they deposited or retrieved a lot 134 from the transfer area 136, 138, and the like.

The instructions 206 further include a scheduling component 228 configured to access the AMHS A fab/area 114 production scheduling (e.g. from the AMHS A control system 108) and the AMHS B fab/area 116 production scheduling (e.g. from the AMHS B control system 110) to determine any transfer requirements/requests. The scheduling component 228 is further configured to determine the vehicle or vehicles (126A-B) in the handshake area 120 that are empty, i.e., available to assist in cross-phase/cross-fab/cross-AMHS transfer of lots 134. The scheduling component 228 then determines which vehicle 126A-126B can be utilized in the transfer. This determination may be dependent upon the speed, capacity and/or other attributes of each particular vehicle. Thereafter, the fastest of the available vehicles 126A-126B is then scheduled/assigned to retrieve the lot 134 to be transferred.

The term "software," as used herein, is intended to encompass any collection or set of instructions executable by a computer or other digital system so as to configure the computer or other digital system to perform the task that is the intent of the software. The term "software" as used herein is intended to encompass such instructions stored in storage medium such as RAM, a hard disk, optical disk, or so forth, and is also intended to encompass so-called "firmware" that is software stored on a ROM or so forth. Such software may be organized in various ways, and may include software components organized as libraries, Internet-based programs stored on a remote server or so forth, source code, interpretive code, object code, directly executable code, and so forth. It is contemplated that the software may invoke system-level code or calls to other software residing on a server or other location to perform certain functions.

Figure 4:
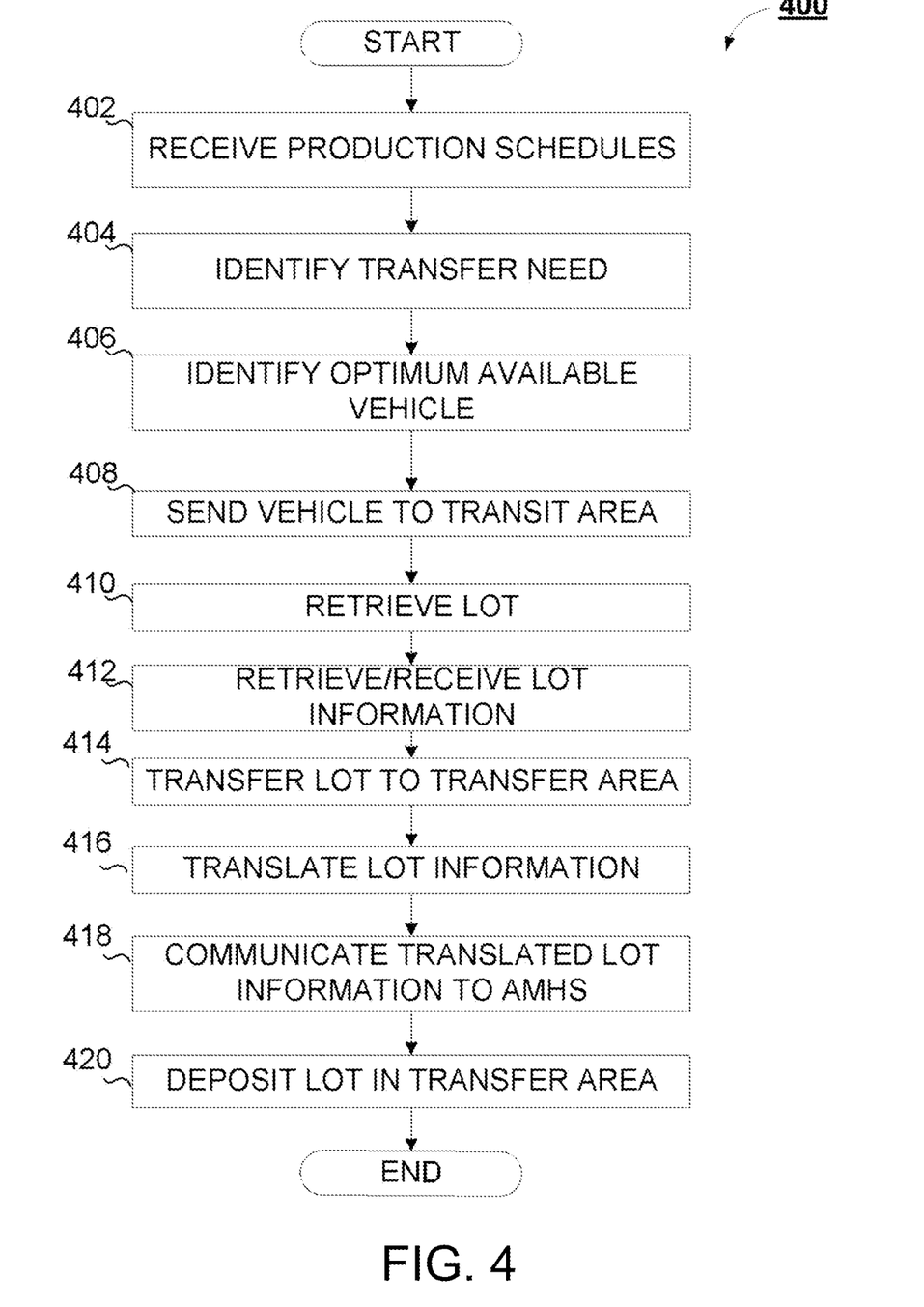
FIG. 4 is a flowchart depicting a method for AMHS interface management in accordance with one embodiment of the subject application.

Turning now to FIG. 4, there is shown an exemplary flowchart depicting a method 400 for AMHS interface management in accordance with one embodiment of the subject application. The method 400 begins at 402, whereupon the processor 202 or other suitable component associated with the handshake control system 106 receives production scheduling from each AMHS control system 108, 110. In accordance with one embodiment, the processor 202, via the scheduling component 228 analyze the production schedule of each AMHS control system 108, 110 to identify, at 404, each cross-phase/cross-AMHS/cross-fab transfer of a lot 134 required.

At 406, the processor 202 or other suitable component associated with the handshake control system 106 identifies a vehicle VHL C1 126A or VHL C2 126B that is currently empty (i.e. not transporting/carrying a wafer carrier) and available to effectuate the transfer. The identified vehicle VHL C1 126A or VHL C2 126B is then dispatched at 408 by the handshake control system 106 to the transfer area 136 or 138 corresponding to where the lot 134 is to be received. In some embodiments, if there are multiple available vehicles then the operation 406 identifies an optimal available vehicle based on information such as distance each vehicle would need to travel to effectuate the transfer, carrying capacity of each available vehicle, priority information for the transfer and other concurrent transfers, traffic information on the AMHS, and so forth. In some such embodiments, a machine learning technique such as a artificial neural network (ANN) may be trained to select the optimal available vehicle based on this information, optionally including real-time traffic information on the AMHS and real-time schedule of transfers currently being performed and to be performed on the AMHS.

At 410, the dispatched vehicle 126A or 126B retrieves the lot 134 from the transfer area 136, 138. The translation component 222 or other suitable component associated with the handshake control system 106 retrieves/receives the lot information corresponding to the lot 134 to be transferred at 412. At 414, the dispatched vehicle 126A or 126B transits the rail 146 of the OHT in the handshake area 120 from one transfer area, e.g. from area 136, to another transfer area, e.g. to area 138 (or vice versa). At 416, the translation component 222, via the database 220, translates the lot information corresponding to the lot 134 being transferred from the originating AMHS/MES to the receiving AMHS/MES. It will be appreciated that the translation performed herein maintains the commands associated with the lot information such that the receiving AMHS/MES is capable of performing the required fabrication. The translated lot information is then communicated from the handshake control system 106 to the receiving AMHS control system 108 or 110 at 418. The dispatched vehicle 126A or 126B transporting the lot 134 then deposits the lot 134 in the transfer area 136 or 138 of the receiving AMHS/MES.

Figure 5:
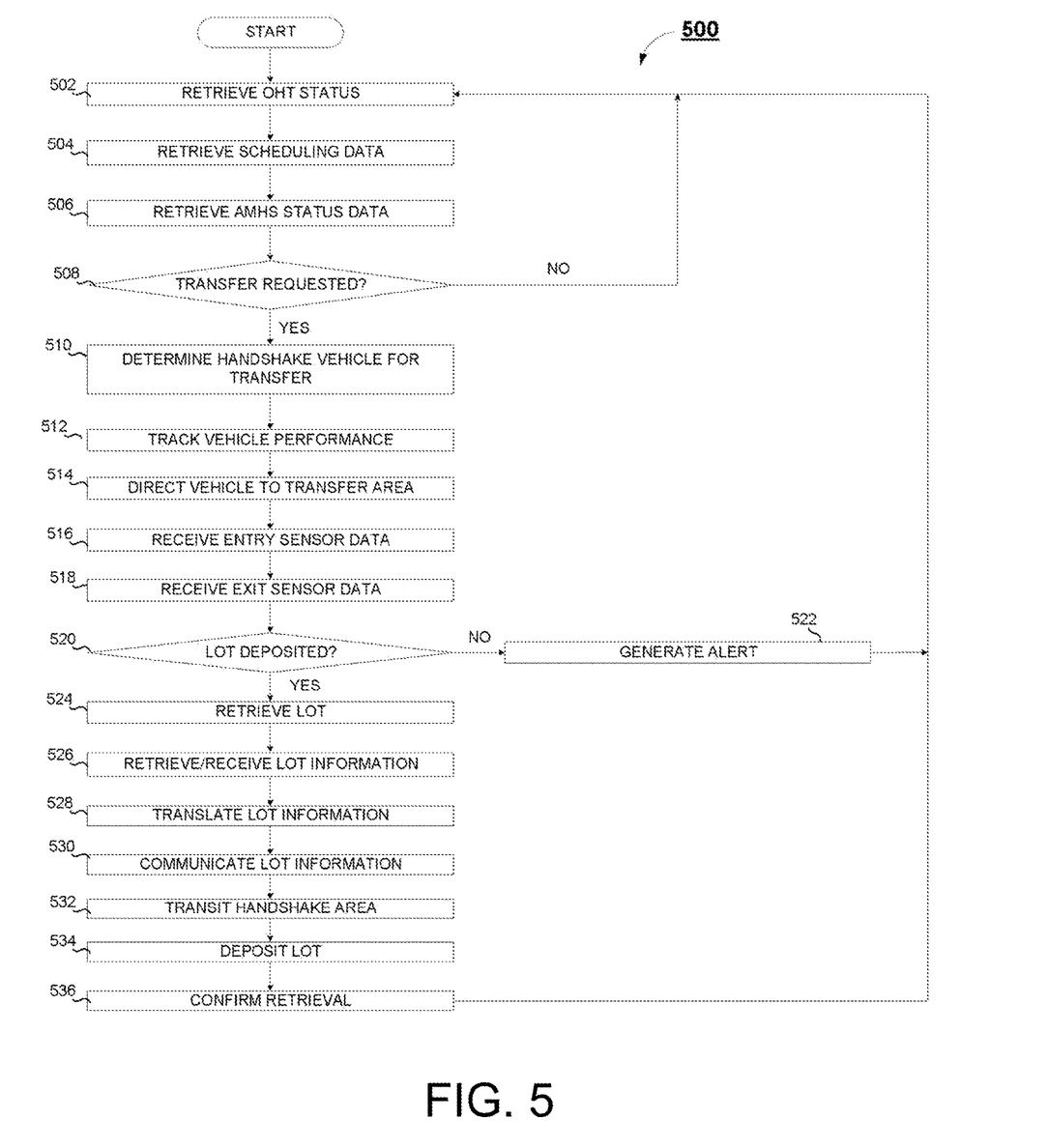
FIG. 5 is a flowchart depicting a method for AMHS interface management in accordance with one embodiment of the subject application.

Referring now to FIG. 5, there is shown a second embodiment of a method 500 for AMHS interface management in accordance with the subject application. In FIG. 5, the method 500 begins at 502, whereupon the tracking component 228 or other suitable component associated with the handshake control system 106 collects status data from the OHT, e.g., handshake vehicles VHL C1 126A and VHL C2 126B, as well as those vehicles from AMHS A fab/area 114 and AMHS B fab/area 116 that have entered and/or exited the respective transfer areas 136, 138. It will be appreciated that such status data includes, for example and without limitation, speed of the vehicle, time spent in the transfer area, direction of travel, type of vehicle, and the like. At 504, the handshake control system 106 retrieves scheduling data from each AMHS control system 108 and 110. In accordance with varying embodiments, the scheduling data may be collected from distinct fab scheduling systems resident on the respective control systems 108, 110, fab scheduling systems that operate independently from the control systems 108, 110, a centralized scheduling system, or any suitable combination thereof. According to one embodiment, the scheduling data includes, for example and without limitation, scheduling requests, lot priority, and the like.

At 506, the handshake control system 106 retrieves AMHS status data from each AMHS control system 108, 110. In accordance with one embodiment, the AMHS status data includes, for example and without limitation, location, time, equipment, lot information, carrier, transfer priority, traffic conditions, and the like. It will be appreciated that the OHT status data, the fab scheduling data, and the AMHS status data may be stored in the database 220 or memory 204 associated with the handshake control system 106. The skilled artisan will further appreciate that the above-identified examples are intended to be nonlimiting, and other types of information related to the OHT, the AMHS, and the schedule of fabrication are contemplated for use herein.

At 508, the handshake control system 106 analyzes the collected data to determine whether a transfer is needed. That is, the handshake control system 106 determines whether a lot 134 needs to be moved from AMHS A fab/area 114 to AMHS B fab/area 116 (or vice versa) in order to complete production. It will be appreciated that such a determination may be made based upon, for example and without limitation, the availability a of particular processing tool 130 in a different fab/area 114, 116, a priority associated with a particular lot 134, scheduled maintenance of a particular processing tool 130 within a fab/area 114, 116, or the like. Upon a negative determination at 508, operations return to 502, whereupon the handshake control system 106 continues to monitor and retrieve the aforementioned data.

Upon a positive determination at 508, i.e. that a cross-phase/cross-AMHS/cross-fab transfer of a lot 134 from one fab/area 114, 116 to another 114, 116 is required, operations proceed to 510, whereupon the handshake control system 106 determines a suitable vehicle 126A, 126B within the handshake area 120 to perform the transfer. According to one embodiment, the vehicle 126A or 126B may be selected based upon its speed, availability, and past performance, as determined from the OHT status data and previous transfers (as discussed below). That is, the handshake control system 106 may predict or forecast which vehicle 126A or 126B can serve future cross-phase/cross-AMHS/cross-fab functions with reliability, speed, and quality. At 512, the handshake control system 106 begins tracking the performance of the selected vehicle 126A or 126B.

At 514, the selected vehicle 126A or 126B is directed to the transfer area 136 or 138 within the handshake area 120 to retrieve the lot 134 requiring cross-phase/cross-AMHS/cross-fab transport. It will be appreciated that the selected vehicle 126A or 126B may be positioned outside the transfer area 136 or 138 to avoid conflicting with another vehicle (e.g. from the originating AMHS area 114 or 116), be positioned within the transfer area 136 or 138 (provided the OHT system employed allows for such positioning), or the like.

At 516, the handshake control system 106 receives sensor data from at least one sensor 140 located within the transfer area 136, 138 indicating that a vehicle has entered the transfer area 136, 138. For example, VHL A1 122A has entered the transfer area 136 from the AMHS A fab/area 114, or VHL B1 124A has entered the transfer area 138 from the AMHS B fab/area 116. The handshake control system 106 then receives sensor data from at least one of the sensors 140 indicating that the vehicle has exited the transfer area 136, 138 at 518. In accordance with one embodiment, the dwell time of the vehicle in the transfer area 136, 138, as well as associated speed and status, may be collected by the handshake control system 106 and utilized in future scheduling requests. At 520, the handshake control system 106 then determines, via one or more sensors 140, whether the lot 134 has been deposited in the transfer area 136, 138. Upon a determination that the lot 134 has not been deposited, operations proceed to 522, whereupon an alert is generated indicating the failure. Thereafter operations with respect to FIG. 5 return to 502 for continued management of cross-phase/cross-AMHS/cross-fab transfer.

Upon a successful deposit of the lot 134 at 520, operations proceed to 524, whereupon the handshake vehicle 126A or 126B retrieves the lot 134 from the transfer area 136, 138. The handshake control system 106, via the translation component 222 or other suitable component associated therewith, retrieves/receives the lot information associated with the lot 134 being transferred at 526. At 528, the lot information is translated from the originating AMHS/MES format into the receiving AMHS/MES format via the translation component 222 of the handshake control system 106. At 530, the translated lot information is communicated from the handshake control system 106 to the receiving AMHS control system, i.e. to AMHS A control system 108 (originating in AMHS B fab/area 116) or to AMHS B control system 110 (originating in AMHS A fab/area 114). The selected vehicle 126A or 126B is then directed to transit the handshake area 120 from one transfer area 136, 138 to the other transfer area 136, 138 at 532.

The lot 134 is then deposited in the transfer area 136, 138 adjacent to the receiving AMHS fab/area 114, 116 by the selected vehicle 126A, 126B at 534. It will be appreciated that the speed, performance, and the like, of the vehicle 126A, 126B obtained during monitoring of the vehicle 126A, 126B as it transfers the lot 134 from one transfer area 136, 138 to the other transfer area 136, 138 may be used by the handshake control system 106 in determining which vehicle 126A, 126B to utilize in future transfer requests. The handshake control system 106 then determines, at 536 whether the lot 134 has been retrieved. In some embodiments, such a determination may be accomplished in accordance with an output of the sensors 140 as the vehicle of the AMHS fab/area 114, 116 receiving the lot 134 transits the transfer area 136, 138, or alternatively, in accordance with an output of other sensor(s) (not shown) that may be configured to optically, thermally, magnetically, via weight, limit switch, pressure switch, RF tag, or other suitable means to determine the presence or absence of the lot 134 after deposit. Upon a negative determination, operations proceed to 522, whereupon an alert may be issued indicating that a problem has occurred. Upon a positive determination, operations return to 502, and the handshake control system 106 continues as described above.

In accordance with a first example embodiment, the AMHS A control system 108 and AMHS B control system 110 are provided by separate vendors. In this embodiment, MES 150 and MES 152 are distinct manufacturing execution systems, utilizing unrelated data formats and instructions. Accordingly, the translation component 222 of the handshake control system 106 is configured to translate the lot information of a lot 134 from the AMHS/MES 150 format/structure to the AMHS/MES 152 format/structure, and vice versa, dependent on the cross-phase/cross-AMHS/cross-fab path, i.e. AMHS A to AMHS B or AMHS B to AMHS A.

In accordance with a second example embodiment, AMHS A control system 108 and AMHS B control system 110 are provided by separate vendors. In this embodiment, MES 150 and MES 152 are different versions of the same manufacturing execution systems. Accordingly, the translation component 222 of the handshake control system 106 is configured to translate the lot information of a lot 134 from the MES 150 format/structure to the MES 152 format/structure, and vice versa, dependent on the cross-phase/cross-AMHS/cross-fab path, i.e. AMHS A to AMHS B or AMHS B to AMHS A.

In accordance with a third embodiment, AMHS A control system 108 and AMHS B control system 110 are provided by separate vendors. In this embodiment, MES 150 and MES 152 are the same versions of a manufacturing execution system, utilizing the same data formats and instructions. Accordingly, the translation component 222 of the handshake control system 106 is configured to translate the lot information of a lot 134 from the AMHS A format/structure to the AMHS B format/structure, and vice versa, dependent on the cross-phase/cross-AMHS/cross-fab path, i.e. AMHS A to AMHS B or AMHS B to AMHS A.

According to yet another embodiment, the systems and methods set forth above enable lot information exchange between disparate vendor-based manufacturing execution systems and automated material handling systems. Further, the systems and methods described above prevent the loss of lot information when a lot is transitioned between two vendor based MES/AHMS systems. The skilled artisan will appreciate that the systems and methods described herein enlarge manufacturing flexibility by enabling a lot to be easily processed in different fabs of different vendors that may utilize disparate MES systems. Further, as illustrated above, the systems and methods described herein provide for real time monitoring of lots as each lot is transported between MES/AHMS systems by interposing an interface system between two or more vendor AMHS/MES systems to translate or convert lot information, including data format and data structure, as a lot transitions from one vendor AMHS/MES system to the next vendor AMHS/MES system.

It will be appreciated that varying embodiments disclosed herein enable the handshake control system 106 to coordinate interaction between two centralized systems, wherein AMHS A and AMHS B both utilize centralized control systems. The embodiments further allow for the handshake control system 106 to coordinate interaction between two decentralized (i.e. distributed) AMHS systems (e.g., a plurality of individual controllers within each AMHS system). Still further embodiments provide for the handshake control system 106 to connect a centralized AMHS system and a decentralized AMHS system, where either AMHS A or AMHS B utilizes a centralized control system and the other AMHS utilizes a distributed control system. In varying embodiments, the sensors 140, implemented as a pass sensor, provides feedback as to which vehicle 122A-C, 124A-B, 126A-B is located in a particular area 136, 138, and in conjunction with the associated database 220, enables the handshake control system 106 to dynamically balance VHL quantity in this area. According to one embodiment, the handshake control system 106 is configured to perform real-time analysis of the data from the sensors, as well as other information (e.g. network, wireless, wi-fi information) to ensure the transfer quality in the interface, i.e. the handshake area 120. The handshake control system 106 may further be configured to make a transportation priority list to order the in (i.e. input) interface priority by lot priority evaluation result.

In accordance with one embodiment, there is provided an automatic material handling system ("AMHS") interface management system, that comprises a handshake control system, comprising a processor in communication with memory. The system also includes a first AMHS system in communication with the handshake control system, and a second AMHS system in communication with the handshake control system. The memory is configured to store instructions which are executed by the processor causing the processor to receive lot information from the first AMHS system in a first format associated with the first AMHS system, and to translate the lot information from the first format associated with the first AMHS system into a second format associated with the second AMHS system.

In accordance with another embodiment, there is provided a method for A method for AMHS interface management. The method includes receiving, at a handshake control system, lot information of a lot located in a first AMHS, the lot information in a first format associated with the first AMHS. The method further includes translating the lot information from the first format to a second format associated with the second AMHS. In addition, the method includes communicating, via an associated network, the translated lot information to a control system of the second AMHS.

In accordance with yet another embodiment, there is provided an automatic material handling system ("AMHS") interface management system that comprises a first AMHS control system, a second AMHS control system, a handshake control system, and at least one handshake vehicle. The first AMHS control system is configured to control a first AMHS area and in communication with an associated network. The second AMHS control system is configured to control a second AMHS area and in communication with the associated network, with the first and second AMHS systems being distinct. The handshake control system controls a handshake area located between the first AMHS area and the second AMHS area for facilitating a transfer of a lot between the first AMHS area and the second AMHS area. The handshake control system is in communication with the first and second AMHS systems via the associated network. The at least one handshake vehicle is a component of an overhead transport within the handshake area, and is configured to transfer the lot between a first transfer area adjacent the first AMHS area and a second transfer area adjacent the second AMHS area. The handshake control system further comprises a processor in communication with memory storing instructions which are executed by the processor causing the processor to receive production scheduling data indicative of a lot requiring transfer between the first and second AMHS areas, and to identify a handshake vehicle for transferring the lot in accordance with the handshake vehicle performance. The instructions further cause the processor to receive lot information from the first AMHS system in a first format associated with the first AMHS system, and to translate the lot information from the first format associated with the first AMHS system into a second format associated with the second AMHS system. In addition, the instructions cause the processor to receive sensor data from at least one sensor positioned in each of the first and second transfer areas, an entry and an exit of a corresponding AMHS vehicle into and out of the first and second transfer areas, and to retrieve the lot from the first transfer area via the identified handshake vehicle in accordance with the received sensor data. Furthermore, the instructions stored in memory cause the processor to communicate the translated lot information to the second AMHS control system, and to transfer, via the identified handshake vehicle, the lot from the first transfer area to the second transfer area.

Some portions of the detailed description herein are presented in terms of algorithms and symbolic representations of operations on data bits performed by conventional computer components, including a central processing unit (CPU), memory storage devices for the CPU, and connected display devices. These algorithmic descriptions and representations are the means used by those skilled in the data processing arts to most effectively convey the substance of their work to others skilled in the art. An algorithm is generally perceived as a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The exemplary embodiment also relates to an apparatus for performing the operations discussed herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the methods described herein. The structure for a variety of these systems is apparent from the description above. In addition, the exemplary embodiment is not described with reference to any particular programming language. It will be appreciated that a variety of programming languages may be used to implement the teachings of the exemplary embodiment as described herein.

A machine-readable medium includes any mechanism for storing or transmitting information in a form readable by a machine (e.g., a computer). For instance, a machine-readable medium includes read only memory ("ROM"); random access memory ("RAM"); magnetic disk storage media; optical storage media; flash memory devices; and electrical, optical, acoustical or other form of propagated signals (e.g., carrier waves, infrared signals, digital signals, etc.), just to mention a few examples.

The methods illustrated throughout the specification, may be implemented in a computer program product that may be executed on a computer. The computer program product may comprise a non-transitory computer-readable recording medium on which a control program is recorded, such as a disk, hard drive, or the like. Common forms of non-transitory computer-readable media include, for example, floppy disks, flexible disks, hard disks, magnetic tape, or any other magnetic storage medium, CD-ROM, DVD, or any other optical medium, a RAM, a PROM, an EPROM, a FLASH-EPROM, or other memory chip or cartridge, or any other tangible medium from which a computer can read and use.

Alternatively, the method may be implemented in transitory media, such as a transmittable carrier wave in which the control program is embodied as a data signal using transmission media, such as acoustic or light waves, such as those generated during radio wave and infrared data communications, and the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An automatic material handling system ("AMHS") interface management system, comprising:
   a handshake control system, comprising a processor in communication with memory;
   a first AMHS system in communication with the handshake control system; and
   a second AMHS system in communication with the handshake control system,
   wherein the memory stores instructions which are executed by the processor causing the processor to:
      receive lot information from the first AMHS system in a first format associated with the first AMHS system, and
      translate the lot information from the first format associated with the first AMHS system into a second format associated with the second AMHS system.

2. The system of claim 1, wherein the first AMHS system utilizes a first MES and the second AMHS system utilizes a second MES.

3. The system of claim 2, wherein the first MES and the second MES are the same.

4. The system of claim 3, wherein the first MES is a first version and the second MES is a second version.

5. The system of claim 1, wherein the handshake control system is configured to control operations within a handshake area, the handshake area located between the first AMHS system and the second AMHS system.

6. The system of claim 5, further comprising at least one vehicle of an overhead transport positioned in the handshake area and in communication with the handshake control system.

7. The system of claim 6, wherein the at least one vehicle is configured to transfer a lot between the first AMHS system and the second AMHS system through the handshake area.

8. The system of claim 7, wherein the handshake area includes a first transfer area associated with the first AMHS system and a second transfer area associated with the second AMHS system.

9. The system of claim 8, wherein the first AMHS system comprises at least one vehicle configured to transport the lot into and out of the first transfer area, and wherein the second AMHS system comprises at least one vehicle configured to transport a lot into and out of the first transfer area.

10. The system of claim 9, wherein the at least one vehicle of the handshake area is configured to transit into each of the first and second transfer areas.

11. The system of claim 10, further comprising:
    at least one sensor positioned in the first transfer area and configured to sense a movement of the corresponding at least one vehicle into and out of the first transfer area; and
    at least one sensor positioned in the second transfer area, the at least one sensor configured to sense a movement of the corresponding at least one vehicle into and out of the second transfer area.

12. A method for AMHS interface management, comprising:
    receiving, at a handshake control system, lot information of a lot in a first AMHS, the lot information in a first format associated with the first AMHS;
    translating the lot information from the first format to a second format associated with the second AMHS; and
    communicating, via an associated network, the translated lot information to a control system of the second AMHS.

13. The method of claim 12, further comprising:
    receiving a production schedule from the first AMHS indicative of a lot requiring transfer from the first AMHS to the second AMHS;
    identifying a vehicle of an overhead transport positioned in a handshake area available for transferring the lot from the first AMHS to the second AMHS; and
    transferring the lot with the identified vehicle through the handshake area.

14. The method of claim 13, further comprising:
    depositing the lot in a first transfer area adjacent the first AMHS via at least one vehicle of an overhead transport of the first AMHS;
    retrieving, from the first transfer area, the lot by the identified vehicle; and
    depositing the lot in a second transfer area adjacent the second AMHS.

15. The method of claim 14, wherein the first format is a first MES and the second format is a second MES.

16. The method of claim 15, wherein the first MES and the second MES are the same.

17. The method of claim 16, wherein the first MES is a first version and the second MES is a second version.

18. An automatic material handling system ("AMHS") interface management system, comprising:
- a first AMHS control system controlling a first AMHS area and in communication with an associated network;
- a second AMHS system controlling a second AMHS area and in communication with the associated network, wherein the first and second AMHS systems are distinct;
- a handshake control system controlling a handshake area located between the first AMHS area and the second AMHS area for facilitating a transfer of a lot between the first AMHS area and the second AMHS area, the handshake control system in communication with the first and second AMHS systems via the associated network;
- at least one handshake vehicle of an overhead transport within the handshake area, the at least one handshake vehicle configured to transfer the lot between a first transfer area adjacent the first AMHS area and a second transfer area adjacent the second AMHS area,
- wherein the handshake control system further comprises a processor in communication with memory storing instructions which are executed by the processor causing the processor to:
  - receive production scheduling data indicative of a lot requiring transfer between the first and second AMHS areas,
  - identify a handshake vehicle for transferring the lot in accordance with the handshake vehicle performance,
  - receive lot information from the first AMHS system in a first format associated with the first AMHS system,
  - translate the lot information from the first format associated with the first AMHS system into a second format associated with the second AMHS system,
  - receive sensor data from at least one sensor positioned in each of the first and second transfer areas, an entry and an exit of a corresponding AMHS vehicle into and out of the first and second transfer areas,
  - retrieve the lot from the first transfer area via the identified handshake vehicle in accordance with the received sensor data,
  - communicate the translated lot information to the second AMHS control system, and
  - transfer, via the identified handshake vehicle, the lot from the first transfer area to the second transfer area.

19. The system of claim 18, wherein the first format is a first MES and the second format is a second MES.

20. The system of claim 19, wherein the first MES and the second MES are the same, or wherein the first MES and the second MES are different versions of the same MES.

* * * * *